(12) United States Patent
Chaussade

(10) Patent No.: US 7,934,029 B2
(45) Date of Patent: Apr. 26, 2011

(54) DATA TRANSFER BETWEEN DEVICES WITHIN AN INTEGRATED CIRCUIT

(75) Inventor: Nicolas Chaussade, Mouans-Sartoux (FR)

(73) Assignee: ARM Limited, Cambridge (GB)

( * ) Notice: Subject to any disclaimer, the term of this patent is extended or adjusted under 35 U.S.C. 154(b) by 46 days.

(21) Appl. No.: 12/320,718

(22) Filed: Feb. 3, 2009

(65) Prior Publication Data

US 2009/0210595 A1 Aug. 20, 2009

(30) Foreign Application Priority Data

Feb. 19, 2008 (GB) .................................. 0803013.2

(51) Int. Cl.
*G06F 13/12* (2006.01)
*H03M 7/38* (2006.01)
(52) U.S. Cl. ................. 710/68; 341/51; 341/87; 341/89
(58) Field of Classification Search .................... 710/68; 341/51, 87, 89
See application file for complete search history.

(56) References Cited

U.S. PATENT DOCUMENTS

| 5,434,568 | A | 7/1995 | Moll |
| 6,144,658 | A | 11/2000 | Lebizay et al. |
| 7,071,848 | B1 | 7/2006 | Khu |
| 7,224,297 | B2 * | 5/2007 | Trout .............................. 341/87 |
| 2005/0015514 | A1 | 1/2005 | Garakani et al. |
| 2008/0005429 | A1 * | 1/2008 | Ludwig et al. .................. 710/68 |

FOREIGN PATENT DOCUMENTS

| JP | 59-171241 | 9/1984 |
| JP | 2002-368623 | 12/2002 |

OTHER PUBLICATIONS

UK Search Report for GB 0803013.2 dated Jun. 19, 2008.

* cited by examiner

*Primary Examiner* — Glenn A Auve
(74) *Attorney, Agent, or Firm* — Nixon & Vanderhye P.C.

(57) ABSTRACT

An integrated circuit 2 is provided including multiple devices 4, 6, 8, 10, 12, 14 for communicating via an interconnect 16. A sending device 18 includes a sideband signal indicating the use of a representation of a repeating data word in place of that repeating data word itself. The receiving device can then form the repeating pattern of data words in response to receipt of the representation. This reduces the bandwidth consumed upon the interconnect 16.

43 Claims, 4 Drawing Sheets

DATA TRANSFER BETWEEN DEVICES WITHIN AN INTEGRATED CIRCUIT

BACKGROUND OF THE INVENTION

1. Field of the Invention

This invention relates to the field of integrated circuits. More particularly, this invention relates to the transfer of data values between different devices within an integrated circuit.

2. Description of the Prior Art

It is known to provide integrated circuits including multiple devices between which data must be transferred. As an example, an integrated circuit may include a processor and a memory between which data values must be transferred. On-chip communication circuitry, such as broadcast busses and point-to-point interconnects are known to provide for this inter-device communication.

Different communication protocols can be used on-chip. Some communication protocols are targeted at providing high bandwidth. Other communication protocols are targeted at providing low power consumption. An example of such on-chip bus protocols are those used within the AXI interconnect architecture designed by ARM Ltd of Cambridge, England.

There is also an increasing trend within the field of integrated circuits to provide a larger number of devices on a single integrated circuit. These integrated circuits are often called system-on-chip (SoC) integrated circuits and can include multiple processors, multiple memories, multiple peripheral devices, and the like. With such system-on-chip integrated circuits the communication circuitry provided fulfils an important role in permitting the required data transfers within the integrated circuit to be efficiently performed.

It is known within the field of data processing to use data compression techniques such as runlength coding. Runlength coding can be particularly useful to compress data such as image data in which significant portions of the data share a common value, e.g. an image may contain large areas with a common pixel value thereby permitting adjacent pixel values to be represented as a run of pixel values with that common pixel value.

SUMMARY OF THE INVENTION

Viewed form one aspect the present invention provides an integrated circuit comprising:

a first device;

a second device;

communication circuitry coupled to said first device and to said second device, said communication circuitry providing data communication between said first device and said second device;

transfer forming circuitry coupled to said first device and said communication circuitry to form a data transfer including a representation of a repeating pattern of data values; and pattern forming circuitry coupled to said second device and responsive to said representation within said data transfer received from said first device using said communication circuitry to form said repeating pattern of data values to be received by said second device.

The present technique recognises that on-chip communication between devices may often involve a transfer of long sequences of data values with a repeating pattern, such as a constant value. As an example, many real life application programs require comparatively large areas of memory to be initialised to a known value, such as zero, as part of their operation. The writing of the zero values into the memory locations limits the speed of this initialisation task and increasing the speed with which the data values are transferred to the memory does not significantly reduce the time taken to complete the initialisation processes as the communication and writing are effectively pipelined. However, the present technique recognises that in many integrated circuits the overall speed of operation is becoming constrained by contention between multiple devices on the integrated circuit for use of the communication circuitry for transferring data values between devices. As an example, an integrated circuit may include multiple processor cores and if one of the processor cores is busy initialising a large area of memory by writing a long sequence of zero values to that memory, then another processor core may be stalled and prevented from performing useful repeating pattern of data values within the data transfer and to substitute the representation of the repeating pattern in place of the repeating pattern. Thus, the first device will generate the repeating pattern and before this is transmitted via the communications circuitry the pattern identifying circuitry will identify this repeating pattern and substitute the representation in place of the repeating pattern thereby shortening the data transfer.

In other embodiments, the first device may not actually generate the repeating pattern of data values and instead the transfer forming circuitry may be responsive to a pattern generating instruction executed by the first device directly to generate a representation of the repeating pattern without the repeating pattern of data values having to be actually formed at the first device. This requires the provision of special instructions, but avoids needlessly generating the repeating pattern of data values at the first device.

It will be appreciated by those in this technical field that the devices within integrated circuits are often classified as bus masters or bus slaves with respect to particular data transfers. The bus master initiates a data transfer and a bus slave responds to that transfer. The transfer initiated may be a write from the bus master to the bus slave or a read of the bus slave by the bus master. The present technique can be used in both of these circumstances, e.g. a representation of a repeating pattern of data values may be used as part of a data transfer that is a write from a bus master to a bus slave and may also be used as part of a data transfer which is reading data values from a bus slave. Accordingly, the transfer forming circuitry and the pattern forming circuitry may be provided at either or both ends of a communication path between a bus master and a bus slave.

It will be appreciated that the repeating pattern of data values could take a wide variety of different forms. There is a balance between increasing the number of types of repeating pattern which can be represented weighed against the additional complexity and overhead associated with providing support for extended types of repeating pattern. In some embodiments the repeating patterns which may be represented will be a pattern of constant values being transmitted. A more specific form of repeating value which may be supported is repeating zero data value transmissions. The circuit overhead and complexity overhead associated with supporting the use of a representation in place of a repeating pattern of zero values provides a high level of return as such repeating patterns of zero values transferred between devices within an integrated circuit are surprisingly common in real life operation. In real life operating systems, copying a context from one application to the context of another application surprisingly often involves the copying of large amounts of repeating pattern data, such as large zeroed areas.

It will be appreciated that the first device and the second device could take a wide variety of different forms. As an example, the devices may be a processor, a memory, or a cache memory. Other forms of device are also possible.

It will be appreciated that the devices within the integrated circuit require modification in order to support the use of a representation in place of a repeating pattern of data values. Such support may not be provided within all the devices within an integrated circuit. As an example, different devices with an integrated circuit may be designed by different entities and some devices may be legacy devices which are infrequently used and where the cost of reengineering the device in order to support the present technique is not justified. Also some devices with an integrated circuit are not intended to be accessed with bursts, such as timers, interrupt controllers, watchdogs, UARTs etc. The gate count overhead of supporting the present techniques is not justified for such devices. Within the context of such integrated circuits where some devices may support the present technique and some devices may not support the present technique, use can be made of a capability signal which is sent between devices to indicate whether or not use of the representation is possible.

In integrated circuits having this capability signal the first data transfer in a sequence of write data transfers can be sent without using the representation even if this were possible so as to receive the capability signal (in the response) from the target device and accordingly determine whether or not the use of the representation for subsequent data transfers would be possible.

It will be appreciated by those in this field that the devices within an integrated circuit conveniently communicate using a memory-mapped scheme for directing data transfers between source and destination. With this scheme, different devices will be allocated means and said second device means;

transfer forming means coupled to said first device and said communication circuitry for forming a data transfer including a representation of a repeating pattern of data values; and pattern forming means coupled to said second device and responsive to said representation within said data transfer received from said first device using said communication circuitry for forming said repeating pattern of data values to be received by said second device.

Viewed from a further aspect the present invention provides a method of operating an integrated circuit having a first device, a second device and communication circuitry coupled to said first device and to said second device, said communication circuitry providing communication between said first device and said second device, said method comprising the steps of:

forming, with transfer forming circuitry coupled to said first device and said communication circuitry, a data transfer including a representation of a repeating pattern of data values; and forming, with pattern forming circuitry coupled to said second device and responsive to said representation within said data transfer received from said first device using said communication circuitry, said repeating pattern of data values to be received by said second device.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
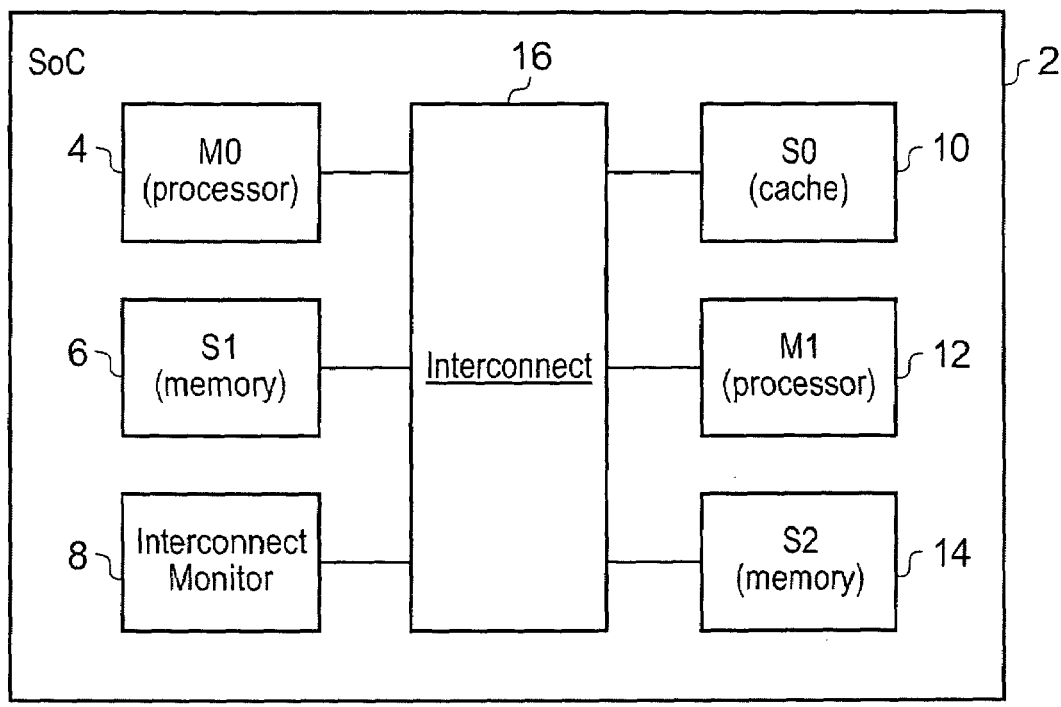
FIG. 1 schematically illustrates an integrated circuit including a plurality of devices communicating via communication circuitry.

FIG. 1 schematically illustrates an integrated circuit 2, including multiple devices 4, 6, 8, 10, 12, and 14 communicating via communication circuitry in the form of an interconnect 16 supporting point-to-point communication. It will be appreciated that in other embodiments the interconnect 16 could be replaced with a bus providing broadcast communication between the devices 4, 6, 8, 10, 12, and 14.

The various devices 4, 6, 8, 10, 12, and 14 include multiple master devices 4, 12 and multiple slave devices 6, 8, 10, and 14. The devices can have the form of, for example, a processor, and a memory, and a cache memory. It will be appreciated by those in this technical field that many other different forms of devices are also possible. An individual device may function both as a master device and/or a slave device depending upon the circumstances and its configuration.

Also illustrated in FIG. 1 is an interconnect monitor 8. The function of this device is to monitor data transfers taking place via the interconnect 16 to ensure that they conform to the expected data transfer protocols. If a defective data transfer is detected, then the interconnect monitor 8 may serve to repair this data transfer or take other action responsive to the error, such as triggering a system reset. The interconnect monitor 8 may be a legacy device and accordingly not responsive to a sideband signal indicating the use of a representation of repeating patterns of data values. In this context, it is useful if a data transfer using such a sideband signal includes a single data value in addition to the sideband signal as the interconnect monitor 8 will then be able to interpret this data transfer as a legacy data transfer of a single data value and will not indicate an error where none exists.

Figure 2:
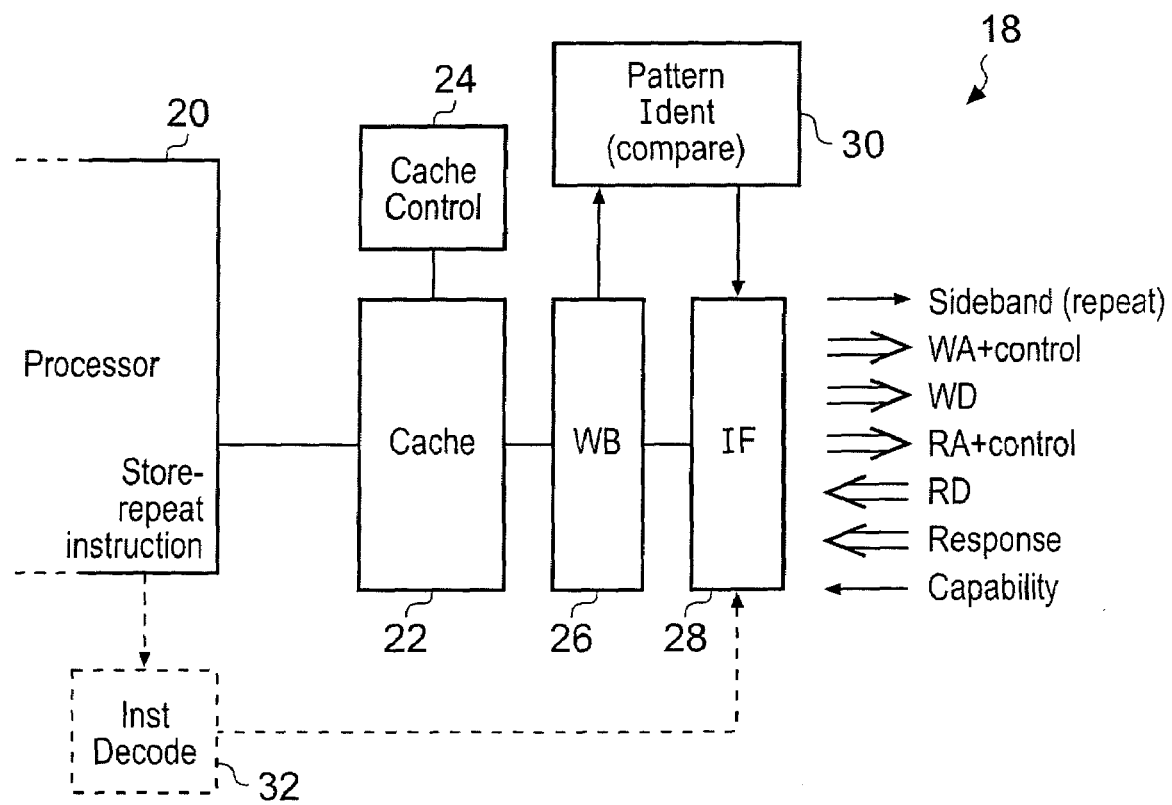
FIG. 2 schematically illustrates a first device provided with a mechanism for using a representation of a repeating pattern of data values in place of those data values within a data transfer.

FIG. 2 illustrates a first device which may be used to send a data transfer. This first device 18 may have the form of a processor 20 having an associated cache memory 22 and cache controller 24. A write buffer 26 is provided within which data values to be written back to the memory system elsewhere on the integrated circuit 2 are buffered prior to being transferred via the interconnect 16 to the target devices, such as one of the memories 6, 14 illustrated in FIG. 1. The write buffer 26 allows potential bursts of data values to be assembled prior to being sent as a data transfer via the interconnect 16 so as to more efficiently use the interconnect 16. A master interface 28 is provided between the write buffer 26 and the interconnect 16. This master interface 28 communicates Write Address and control signals, Write Data signals, Read Address and control signals, Read Data signals, and target response signals. Also illustrated in FIG. 2 are a sideband signal associated with the Write Address and control signals which is sent with a data transfer to indicate that the data transfer includes a representation of a repeating pattern of data values. In one embodiment the data transfers may have up to a maximum of an eight word length and a sideband signal indicating a repeating data value may be used to indicate that a constant data value is to be used for each of those eight words. The constant value may be transmitted in some embodiments as a single data value sent as part of that data transfer with a transfer length of one data value. In other embodiments, the sideband signal itself may indicate which data value is to be repeated. In particular, there is a common case where data values of zero are to be sent and accordingly a sideband signal may be provided which itself indicates that a data transfer of eight zero values is taking place and the zero data value itself need not be transferred. The receiving device responds to the sideband signal to form the eight zero values at the receiving device to be written into the receiving device.

Also illustrated within FIG. 2 is pattern identifying circuitry 30. This pattern identifying circuitry 30 includes comparators which serve to snoop data values within the write buffer 26 to identify repeating patterns of data values. In a simple case the pattern identifying circuitry 30 may be used to identify a sequence of eight adjacent zero values to be written to a receiving device. When a repeating pattern of data values is identified, the pattern identifying circuitry 30 signals this to the interface 28 which then generates the sideband signal to be sent with the data transfer writing that repeating pattern of data values to the receiving device. The data transfer can then be shortened to only a single data word length and either a single data word representing the repeating data word can be transmitted or no data word in the case where the sideband signal itself represents the single data value.

As an alternative (or in addition) to the use of the pattern identifying circuitry 30, there is shown in dashed line form the use of specific store-repeat instructions by the processor 20. The processor 20 can be provided with instructions within its architecture which allow the processor 20 to identify situations in which it wishes to write a repeating data value to memory locations. The use of such instructions can be detected by instruction decoder circuitry 32 and this instruction decoder circuitry 32 used to signal to the interface 28 that the sideband signal should be generated (and insert the necessary single data value if one is being used) to represent the repeating data values.

Figure 3:
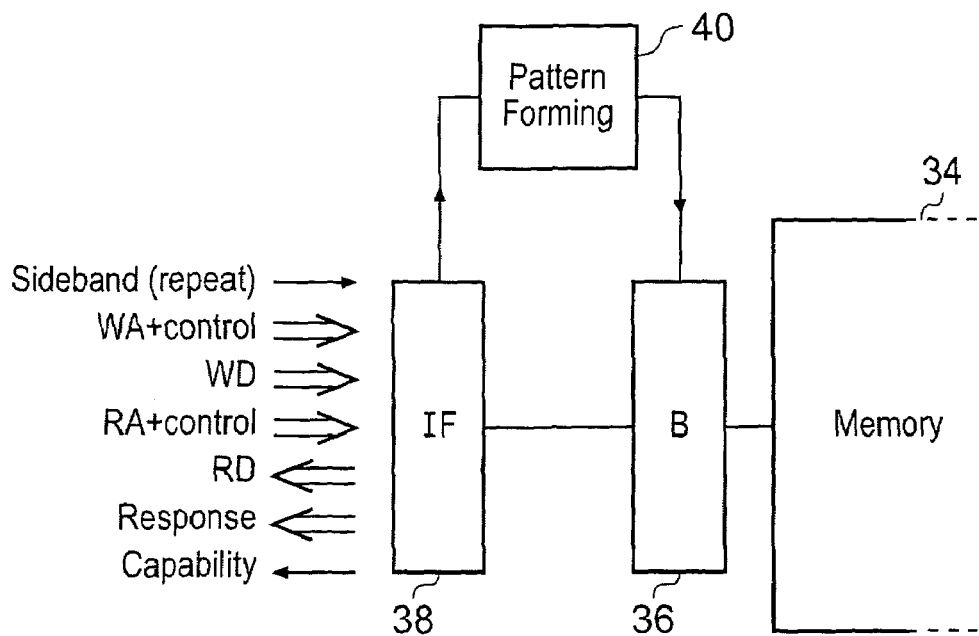
FIG. 3 schematically illustrates a device having a mechanism for receiving a representation of a repeating pattern of data values in place of those data values within a data transfer.

FIG. 3 illustrates an example of a receiving device supporting the use of representations of repeating data values. This receiving device in the example shown in FIG. 3 is a memory 34 with an associated buffer 36 into which memory lines are assembled prior to being written to the memory 34. A slave interface 38 connects to the interconnect 16 and has associated with it the same signals which were associated with the master interface 28 of FIG. 2. The receiving device is provided with pattern forming circuitry 40 which is responsive to the sideband signal to form within the buffer 36 a repeating pattern data values. The repeating pattern of data values may be indicated by the sideband signal itself may be formed by copying a single data value received in the associated data transfer multiple times into the buffer 36.

In embodiments without a buffer 36, a data value to be used repeatedly may instead be held at a read input to the memory 34 and the memory controlled to read that unheld value multiple times into respective memory locations, thereby forming the repeating pattern of data values that are transferred.

Illustrated in FIG. 3 (and also in FIG. 2) is a capability signal associated with the response signals sent by the receiving device to the sending device. This capability signal can either have a positive value indicating that the receiving device is capable of supporting the use of representations of repeating patterns of data values or a negative value indicating that the receiving device does not have this capability. Upon a first write data transfer to a receiving device the sending device can be configured not to use the representation of a repeating data value even if this is possible as it will not yet have received a capability signal from that receiving device indicating whether or not such representations are supported. Following a first communication with a receiving device and the return of a capability signal, the sending device can then use or not use the representation when appropriate depending upon whether or not the receiving device supports this functionality.

In the case of read data transfer request, the slave device can respond with a capability signal accompanying the read data it is returning so as to indicate that it is using the representation. The slave device can determine from a sideband signal (e.g. associated with the read address and control signals—not shown) that the master device sending the read request is able to support use of the representation of repeating values.

Figure 4:
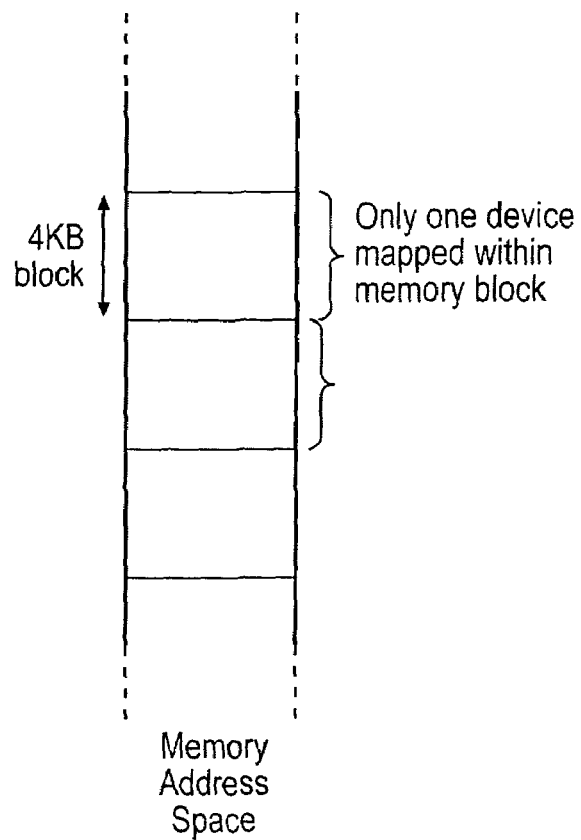
FIG. 4 schematically illustrates the division of memory address space into blocks within which only one memory-mapped device may be provided.

FIG. 4 illustrates memory address space into which memory mapped devices can be mapped for the purpose of addressing those devices. It will be known by those in this technical field that a minimum-sized device memory block is associated with the memory address space. The designer is constrained to map one device within such a minimum-sized device memory block such that a sending device can assume that any data transfers within a minimum-sized device memory block are taking place to the same device. When a boundary between such minimum-sized device memory blocks is crossed, this assumption is no longer valid and must be rechecked. Accordingly, the pattern identifying circuitry 30 of FIG. 2 as well as being gated in its action by the previous receipt of a positive capability signal indicating that the receiving device within the current minimum-sized device memory block is capable of responding to the representations, will reset this capability on traversing such a boundary until a further data transfer without using the representation has taken place and another capability signal has been received from the device within the new minimum-sized device memory block indicating that it is capable of supporting the representation of repeating data values.

Figure 5:
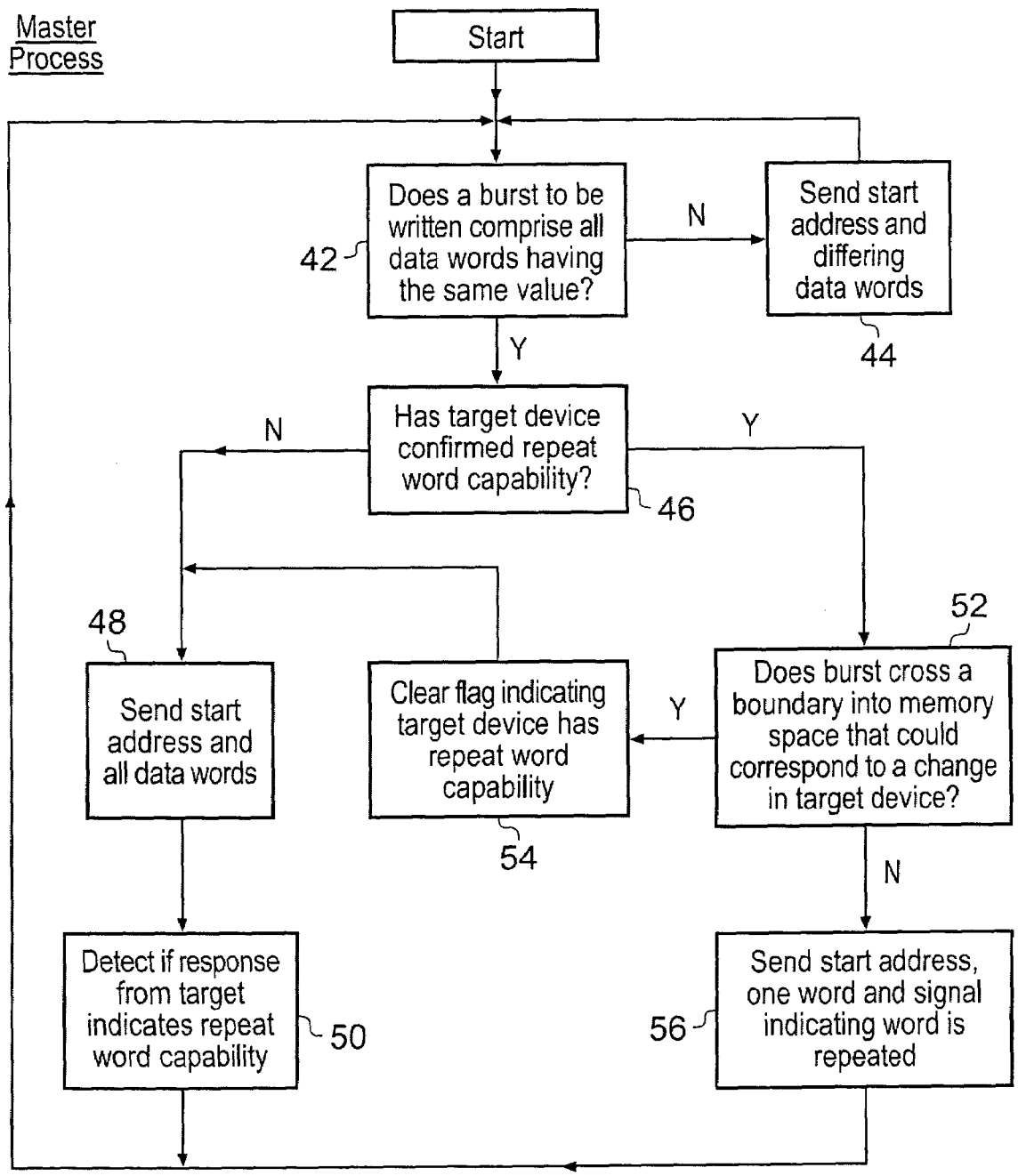
FIG. 5 is a flow diagram schematically illustrating the processing performed at a device sending a data transfer and supporting the use of a representation of a repeating pattern of data values in place of those data values.

FIG. 5 is a flow diagram schematically illustrating the processing performed by a writing master device. At step 42 a determination is made as to whether a burst of data values to be transferred comprises data words all having the same value. If this is not the case, then the burst is sent using different data words at step 44 and processing returns to step 42. Bursts containing differing data values are the norm and accordingly most of the data transfers will be processed using step 44. However, in the case of initialisation of large areas of memories, or other situations in which large blocks of a constant data value are to be written, then the determination at step 42 will identify that all the data words within a burst have a common data value. Processing will then proceed to step 46. Step 46 determines whether the target device has already confirmed its capability for supporting representations of repeating data values in place of those repeating data values. If the target device has not already confirmed this capability, then processing proceeds to step 48 where all of the data words are separately sent even though they are of constant value. Step 50 then observes the response from the target device to see if it includes a capability signal indicating that the target device is capable of supporting representations of repeated data words. If the target device is so capable, then this information is latched as the capability of the current target device such that subsequent transfers to that target device can use the representation in place of a repeating data value if possible.

If the determination at step 46 is that the target device has confirmed a repeat word capability, then step 52 determines whether the burst will cross a boundary into memory space that could correspond to a change in target device e.g. crosses a minimum-size device memory block boundary. If such a boundary is crossed, then the processing proceeds to step 54 where the flag indicating that the target device has repeat word capabilities is cleared and processing continues without this capability assumption at step 48. If the determination at step 52 is that such a boundary is not crossed, then processing proceeds to step 56 where the representation is used in place of sending a repeating pattern of data values. The data transfer in this example will include a start address, one word which is the repeated data value, and a sideband signal indicating that the one word is to be used to form a complete burst of words at the receiving device (e.g. eight words in the case of an eight word burst system).

Figure 6:
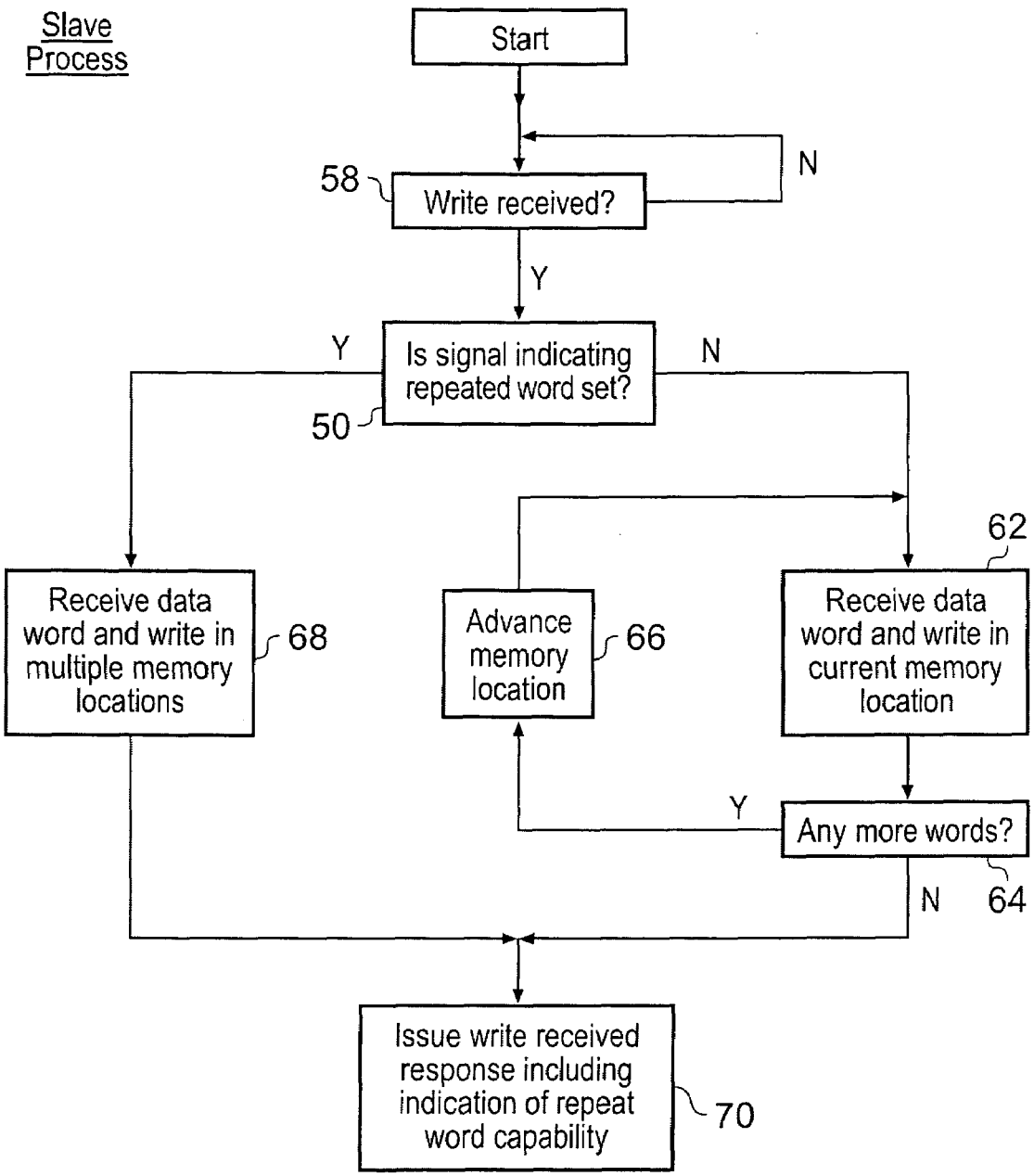
FIG. 6 is a flow diagram schematically illustrating the processing performed at a receiving device which may receive a data transfer including a representation of a repeating data value in place of the repeating data value within the data transfer.

FIG. 6 is a flow diagram illustrating the processing which may be performed at a receiving device. At step 58 the system waits for a write to be received. At step 60 a determination is made as to whether or not the sideband signal indicating that a representation is being used for a repeating data value is asserted. If this sideband signal is not asserted, then processing proceeds to step 62 where a data word is received and written into a memory location. Step 64 determines whether or not the burst has finished and step 66 advances the memory location between the writing of separately received data words.

If the determination at step 60 is that the sideband signal is asserted indicating that a representation of a repeating pattern is being used, then processing proceeds to step 68 where the single data word which is to be used as the template for the repeating pattern is received. This single data word is then copied to multiple memory locations.

After step 68 or when the determination at step 64 is that there are no more words within a burst, processing proceeds to step 70 where a write received response is issued by the receiving device to the sending device. This response will include a capability signal indicating that the receiving device includes the capability of using representations of repeating data words. This capability signal can be used to trigger the use of such representations by the sending device if this has not already been notified to the sending device.

It will be appreciated that the processing of FIG. 6 illustrates the processing performed by a receiving device which is capable of using the representation. A receiving device which is not so capable will use steps 58, 62, 64, and 66. It will omit steps 60 and 68. Step 70 will issue the response but will not include the repeat word capability (i.e. it will send a negative capability signal) indicating that the memory device is capable of supporting use of the representation of repeating patterns of data words.

Whilst the above describes the technique in the context of write transfers, it may also be used for read transfers where the slave device returns the read data for repeating data values using the representation if both devices support its use.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit comprising:
   a first device;
   a second device;
   communication circuitry coupled to said first device and to said second device, said communication circuitry providing data communication between said first device and said second device;
   transfer forming circuitry coupled to said first device and said communication circuitry to form a data transfer including a representation of a repeating pattern of data values; and
   pattern forming circuitry coupled to said second device and responsive to said representation within said data transfer received from said first device using said communication circuitry to form said repeating pattern of data values to be received by said second device, wherein said representation is a sideband signal accompanying said data transfer, said data transfer includes a single data value and said pattern forming circuitry is responsive to said sideband signal to form said repeating pattern from said single data value, wherein a further device, coupled to said communication circuitry and not responsive to said sideband signal, detects said data transfer as a data transfer of said single data value alone.

2. An integrated circuit as claimed in claim 1, wherein said transfer forming circuitry comprises pattern identifying circuitry coupled to said first device and responsive to said data transfer comprising a plurality of data values to be sent from said first device to said second device using said communication circuitry to identify said repeating pattern of data values within said data transfer and to substitute said representation of said repeating pattern in place of said repeating pattern within said data transfer.

3. An integrated circuit as claimed in claim 2, wherein said pattern identifying circuitry comprises comparitor circuitry for comparing a plurality of data values to be sent to said second device and stored within a buffer coupled to said first device.

4. An integrated circuit as claimed in claim 1, wherein said transfer forming circuitry is responsive to a pattern generating instruction executed by said first device to generate said representation of a repeating pattern of data values as at least part of said data transfer.

5. An integrated circuit as claimed in claim 1, wherein said first device is a bus master, said second device is a bus slave and said data transfer is a write operation to said bus slave.

6. An integrated circuit as claimed in claim 1, wherein said first device is a bus slave, said second device is a bus master and said data transfer is a read operation from said bus slave.

7. An integrated circuit as claimed in claim 1, wherein said repeating pattern of data values is a repeating constant data value.

8. An integrated circuit as claimed in claim 7, wherein said repeating pattern of data values is a repeating zero data value.

9. An integrated circuit as claimed in claim 1, wherein at least one of said first device and said second device is:
   a processor;
   a memory; and
   a cache memory.

10. An integrated circuit as claimed in claim 1, comprising a third device coupled to said communication circuitry.

11. An integrated circuit as claimed in claim 10, wherein, said third device is responsive to a write data transfer received from said first device to return a negative capability signal indicating that said third device is not capable of responding to said representation to form said repeating pattern of data values, said first device being responsive to said negative capability signal to send data transfers including repeating patterns of data values to said third device without using said representation.

12. An integrated circuit as claimed in claim 10, wherein said third device is responsive to a read data transfer request received from said second device to return a negative capability signal indicating that said third device is not capable of providing said representation in place of said repeating pattern of data values, said second device being responsive to said negative capability signal to receive data transfers including repeating patterns of data values from said second device without using said representation.

13. An integrated circuit as claimed in claim 1, wherein said communication circuitry is interconnect circuitry providing point-to-point data communication between devices.

14. An integrated circuit as claimed in claim 1, wherein said communication circuitry is bus circuitry providing broadcast data communication between devices.

15. An integrated circuit as claimed in claim 1, wherein said representation is a sideband signal accompanying said data transfer, said sideband signal specifies a data value to be used by said pattern forming circuitry to form said repeating pattern.

16. An integrated circuit as claimed in claim 1, wherein said pattern forming circuitry copies a data value to a plurality of positions within a buffer coupled to said second device to form said repeating pattern of data values to be received by said second device.

17. An integrated circuit as claimed in claim 1, wherein said pattern forming circuitry holds a data value to be read a plurality of times by said second device to form said repeating pattern of data values to be received by said second device.

18. An integrated circuit comprising:
a first device;
a second device;
communication circuitry coupled to said first device and to said second device, said communication circuitry providing data communication between said first device and said second device;
transfer forming circuitry coupled to said first device and said communication circuitry to form a data transfer including a representation of a repeating pattern of data values; and
pattern forming circuitry coupled to said second device and responsive to said representation within said data transfer received from said first device using said communication circuitry to form said repeating pattern of data values to be received by said second device, wherein said second device is responsive to a write data transfer received from said first device to return a positive capability signal indicating that said second device is capable of responding to said representation to form said repeating pattern of data values, said first device being responsive to said positive capability signal to send data transfers including repeating patterns of data values to said second device using said representation.

19. An integrated circuit as claimed in claim 18, wherein a first data transfer in a sequence of write data transfers sent to another device is sent without using said representation.

20. An integrated circuit as claimed in claim 18, wherein memory address space of said integrated circuit comprises a plurality of minimum-size device memory blocks having a minimum memory block size within which no more than one device may be memory mapped and a first write data transfer following crossing a boundary between minimum-size device memory blocks is sent without using said representation.

21. An integrated circuit comprising:
a first device;
a second device;
communication circuitry coupled to said first device and to said second device, said communication circuitry providing data communication between said first device and said second device;
transfer forming circuitry coupled to said first device and said communication circuitry to form a data transfer including a representation of a repeating pattern of data values; and
pattern forming circuitry coupled to said second device and responsive to said representation within said data transfer received from said first device using said communication circuitry to form said repeating pattern of data values to be received by said second device, wherein said first device is responsive to a read data transfer request received from said second device to return a positive capability signal indicating that said first device is capable of providing said representation in place of said repeating pattern of data values, said second device being responsive to said positive capability signal to receive data transfers including repeating patterns of data values from said first device using said representation.

22. An integrated circuit comprising:
first device;
second device;
communication means, coupled to said first device and to said second device, for providing data communication between said first device and said second device;
transfer forming means coupled to said first device and said communication circuitry for forming a data transfer including a representation of a repeating pattern of data values; and
pattern forming means coupled to said second device and responsive to said representation within said data transfer received from said first device using said communication circuitry for forming said repeating pattern of data values to be received by said second device, wherein said representation is a sideband signal accompanying said data transfer, said data transfer includes a single data value and said pattern forming means is responsive to said sideband signal to form said repeating pattern from said single data value, including a further device means, coupled to said communication circuitry and not responsive to said sideband signal, for detecting said data transfer as a data transfer of said single data value alone.

23. A method of operating an integrated circuit having a first device, a second device and communication circuitry coupled to said first device and to said second device, said communication circuitry providing communication between said first device and said second device, said method comprising the steps of:
forming, with transfer forming circuitry coupled to said first device and said communication circuitry, a data transfer including a representation of a repeating pattern of data values; and
forming, with pattern forming circuitry coupled to said second device and responsive to said representation within said data transfer received from said first device using said communication circuitry, said repeating pattern of data values to be received by said second device, wherein said representation is a sideband signal accompanying said data transfer, said data transfer includes a single data value and said pattern forming circuitry is responsive to said sideband signal to form said repeating pattern from said single data value, wherein a further device, coupled to said communication circuitry and not responsive to said sideband signal, detects said data transfer as a data transfer of said single data value alone.

24. A method as claimed in claim 23, wherein said step of forming a data transfer is responsive to said data transfer comprising a plurality of data values to be sent from said first device to said second device using said communication circuitry to identify said repeating pattern of data values within said data transfer and to substitute said representation of said repeating pattern in place of said repeating pattern within said data transfer.

25. A method as claimed in claim 24, wherein said step of forming a data transfer compares a plurality of data values to be sent to said second device and stored within a buffer coupled to said first device.

26. A method as claimed in claim 23 wherein said step of forming is responsive to a pattern generating instruction executed by said first device to generate said representation of a repeating pattern of data values as at least part of said data transfer.

27. A method as claimed in claim 23, wherein said first device is a bus master, said second device is a bus slave and said data transfer is a write operation to said bus slave.

28. A method as claimed in claim 23, wherein said first device is a bus slave, said second device is a bus master and said data transfer is a read operation from said bus slave.

29. A method as claimed in claim 23, wherein said repeating pattern of data values is a repeating constant data value.

30. A method as claimed in claim 29, wherein said repeating pattern of data values is a repeating zero data value.

31. A method as claimed in claim 23, wherein at least one of said first device and said second device is:
   a processor;
   a memory; and
   a cache memory.

32. A method as claimed in claim 23, wherein a third device is coupled to said communication circuitry.

33. A method as claimed in claim 32, wherein said third device is responsive to a data transfer received from said first device to return a negative capability signal indicating that said third device is not capable of responding to said representation to form said repeating pattern of data values, said first device being responsive to said negative capability signal to send data transfers including repeating patterns of data values to said third device without using said representation.

34. A method as claimed in claim 32, wherein said third device is responsive to a read data transfer request received from said second device to return a negative capability signal indicating that said third device is not capable of providing said representation in place of said repeating pattern of data values, said second device being responsive to said negative capability signal to receive data transfers including repeating patterns of data values from said second device without using said representation.

35. A method as claimed in claim 23, wherein said communication circuitry is interconnect circuitry providing point-to-point data communication between devices.

36. A method as claimed in claim 23, wherein said communication circuitry is bus circuitry providing broadcast data communication between devices.

37. A method as claimed in claim 23, wherein said representation is a sideband signal accompanying said data transfer, said sideband signal specifies a data value to be used by said pattern forming circuitry to form said repeating pattern.

38. A method as claimed in claim 23 wherein said step of forming a repeating pattern copies a data value to a plurality of positions within a buffer coupled to said second device to form said repeating pattern of data values to be received by said second device.

39. A method as claimed in claim 23, wherein said step of forming a repeating pattern holds a data value to be read a plurality of times by said second device to form said repeating pattern of data values to be received by said second device.

40. A method of operating an integrated circuit having a first device, a second device and communication circuitry coupled to said first device and to said second device, said communication circuitry providing communication between said first device and said second device, said method comprising the steps of:
   forming, with transfer forming circuitry coupled to said first device and said communication circuitry, a data transfer including a representation of a repeating pattern of data values; and
   forming, with pattern forming circuitry coupled to said second device and responsive to said representation within said data transfer received from said first device using said communication circuitry, said repeating pattern of data values to be received by said second device, wherein said second device is responsive to a data transfer received from said first device to return a positive capability signal indicating that said second device is capable of responding to said representation to form said repeating pattern of data values, said first device being responsive to said positive capability signal to send data transfers including repeating patterns of data values to said second device using said representation.

41. A method as claimed in claim 40, wherein a first data transfer in a sequence of data transfers sent to another device is sent without using said representation.

42. A method as claimed in claim 40, wherein memory address space of said integrated circuit comprises a plurality of minimum-size device memory blocks having a minimum memory block size within which no more than one device may be memory mapped and a first data transfer following crossing a boundary between minimum-size device memory blocks is sent without using said representation.

43. A method of operating an integrated circuit having a first device, a second device and communication circuitry coupled to said first device and to said second device, said communication circuitry providing communication between said first device and said second device, said method comprising the steps of:
   forming, with transfer forming circuitry coupled to said first device and said communication circuitry, a data transfer including a representation of a repeating pattern of data values; and
   forming, with pattern forming circuitry coupled to said second device and responsive to said representation within said data transfer received from said first device using said communication circuitry, said repeating pattern of data values to be received by said second device, wherein said first device is responsive to a read data transfer request received from said second device to return a positive capability signal indicating that said first device is capable of providing said representation in place of said repeating pattern of data values, said second device being responsive to said positive capability signal to receive data transfers including repeating patterns of data values from said first device using said representation.

* * * * *